United States Patent
Damadian et al.

(10) Patent No.: US 7,408,348 B1
(45) Date of Patent: Aug. 5, 2008

(54) HAND OPERATED DEVICE FOR CONTROLLING CHARACTERISTICS OF AN MRI IMAGE, AND THE LIKE

(75) Inventors: Jevan Damadian, East Northport, NY (US); John Linardos, Smithtown, NY (US)

(73) Assignee: Fonar Corporation, Melville, NY (US)

( * ) Notice: Subject to any disclaimer, the term of this patent is extended or adjusted under 35 U.S.C. 154(b) by 0 days.

(21) Appl. No.: 10/199,697

(22) Filed: Jul. 19, 2002

Related U.S. Application Data

(60) Provisional application No. 60/306,587, filed on Jul. 19, 2001.

(51) Int. Cl.
*G01V 3/00* (2006.01)
(52) U.S. Cl. .................................. 324/318
(58) Field of Classification Search ......... 324/300–322, 324/318, 307, 309; 600/411; 700/85; 345/158, 345/161; D14/412; 463/36–38
See application file for complete search history.

(56) References Cited

U.S. PATENT DOCUMENTS

| | | | |
|---|---|---|---|
| 4,674,046 A | 6/1987 | Ozeki et al. |
| 4,737,921 A | 4/1988 | Goldwasser et al. |
| 4,871,966 A | 10/1989 | Smith et al. |
| 4,875,485 A | 10/1989 | Matsutani |
| 5,038,783 A | 8/1991 | Dumoulin |
| 5,050,608 A | 9/1991 | Watanabe et al. |
| 5,153,546 A | 10/1992 | Laskaris |
| 5,211,165 A | 5/1993 | Dumoulin et al. |
| 5,239,265 A | 8/1993 | Sugahara |
| 5,271,400 A | 12/1993 | Dumoulin et al. |
| 5,349,296 A | 9/1994 | Cikotte et al. |
| 5,365,927 A | 11/1994 | Roemer et al. |
| 5,431,161 A | 7/1995 | Ryals et al. |
| 5,512,826 A | 4/1996 | Hardy et al. |
| 5,512,827 A | 4/1996 | Hardy et al. |
| 5,514,962 A | 5/1996 | Cline et al. |

(Continued)

*Primary Examiner*—Brij B. Shrivastav
*Assistant Examiner*—Dixomara Vargas
(74) *Attorney, Agent, or Firm*—Brandon N. Sklar; Kaye Scholer LLP

(57) ABSTRACT

A hand operated device for controlling characteristics of a magnetic resonance ("MR") image is disclosed. One characteristic that the hand operated device is particularly suited to control is the oblique angle the MR image slice. In one embodiment, the device comprises a planar member, such a plate, rotatably coupled to a supporting member. The supporting member may be a longitudinal member supported by a base. Rotation of the plate is detected by detectors coupled to an MRI system. The oblique angle of an MRI image is changed based on the rotation of the plate, as detected by the detectors. The supporting member may be telescoping and the depression and retraction of to the plate towards and away from the base may be used to vary the depth of the image slice. The telescoping feature can also be used vary other image characteristics, such as slice thickness, field of view and resolution, for example, in addition to or instead of slice depth. Buttons may also be provided on the plate to select a coronal, saggital or axial alignment of the slice image. Methods of conducting MRI scans, and MRI systems including the hand operated device are also disclosed. The device, methods and systems of the invention are particularly suitable for use by a surgeon during a surgical procedure, to obtain magnetic resonance images of a site of interest in a desired orientation.

62 Claims, 9 Drawing Sheets

U.S. PATENT DOCUMENTS

| | | |
|---|---|---|
| 5,584,293 A | 12/1996 | Darrow et al. |
| 5,647,361 A | 7/1997 | Damadian |
| 6,023,165 A | 2/2000 | Damadian et al. |
| 6,108,573 A | 8/2000 | Debbins et al. |
| 6,119,032 A | 9/2000 | Martin et al. |
| 6,135,958 A | 10/2000 | Mikula-Curtis et al. |
| 6,157,194 A | 12/2000 | Vassallo et al. |
| 6,166,544 A | 12/2000 | Debbins et al. |
| 6,201,394 B1 | 3/2001 | Danby et al. |
| 6,267,769 B1 * | 7/2001 | Truwit .................. 606/130 |
| 6,400,157 B1 | 6/2002 | Bonanni et al. |
| 6,470,207 B1 * | 10/2002 | Simon et al. ............. 600/426 |
| 6,512,373 B1 * | 1/2003 | Griffin et al. ............ 324/318 |

* cited by examiner

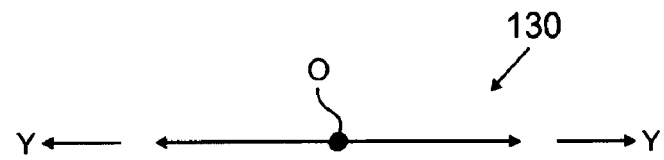
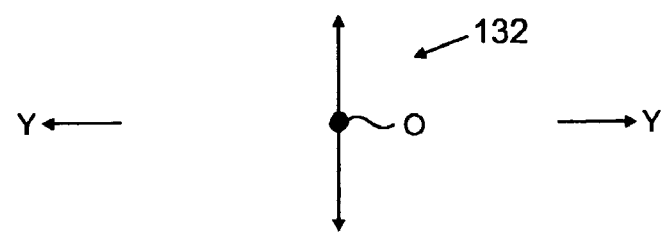
FIG. 9
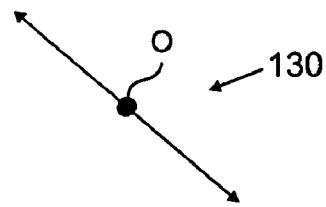
FIG. 10
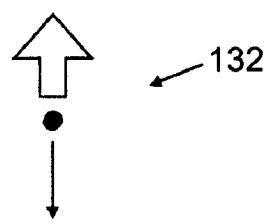

HAND OPERATED DEVICE FOR CONTROLLING CHARACTERISTICS OF AN MRI IMAGE, AND THE LIKE

This application claims the benefit of U.S. Provisional Application No. 60/306,587, which was filed on Jul. 19, 2001 and is incorporated by reference herein.

FIELD OF THE INVENTION

The present invention relates to methods and systems for conducting magnetic resonance imaging and, more particularly, to the control of magnetic resonance image characteristics by a hand operated device.

BACKGROUND OF THE INVENTION

Magnetic resonance imaging ("MRI") is a well known, highly useful, non-invasive technique for diagnosing abnormalities in biological tissue. MRI can detect abnormalities which are difficult or impossible to detect by other techniques, without the use of x-rays or invasive surgical procedures.

Magnetic resonance imaging uses changes in the angular momentum or spin of the atomic nuclei of certain elements within body tissue in a static magnetic field after excitation by radio frequency energy, to derive images containing useful information concerning the condition of the tissue. During a magnetic resonance imaging procedure, the patient is inserted into an imaging volume of a magnet that generates a static magnetic field. Gradient coils are provided within the imaging volume to generate time-varying magnetic fields along the x, y, z axis within the imaging volume, as well. Within the imaging volume, the net vector of the angular momentum or spin of nuclei of elements containing an odd number of protons or neutrons tends to align with the direction of the magnetic field. The spins of the nuclei then turn or "precess" around the direction of the applied primary magnetic field.

Exciting the nuclei of the tissue within the imaging volume by radio frequency energy at the resonant or Larmor frequency shifts the spins out of alignment with the applied magnetic field and into phase with each other. After application of the radio frequency energy has ended, the spins of the nuclei relax and return to their original spin states. As the spins relax, the nuclei emit small radio frequency signals, referred to as magnetic resonance ("MR") signals, at the resonant or Larmor frequency, which are detected by a radio frequency antenna tuned to that frequency. The gradient magnetic fields applied during the pulse sequence spatially encode the MR signals emitted by the nuclei. After the cessation of the application of radio frequency waves, the precessing spins gradually drift out of phase with one another and back into alignment with the direction of the applied magnetic field. This causes the MR signals emitted by the nuclei to decay. The MR signals are detected by a radio frequency receiving antenna positioned within the imaging volume proximate the patient and are amplified, digitized and processed by the MRI system. Hydrogen is the most commonly detected element because it is the most abundant nuclei in the human body and emits the strongest MR signal.

The relaxation rate of the MR signals varies for different types of tissue, including injured or diseased tissue, such as cancerous tissue. The MR signals are analyzed by known mathematical techniques to provide information about the environment, as well as the concentrations, of nuclei of interest at various locations within the patient's body may be determined. This information is typically displayed as an image with varying intensities that are a function of the concentration and environment of the nuclei of interest.

A magnetic resonance imaging procedure typically comprises one or more image scanning sequences, each of which comprises a precisely timed and orchestrated series of pulses of radio-frequency energy, and variation of the three orthogonal magnetic field gradients and the data sampling window. Each scanning sequence is defined by a pulse sequence, which is a series of values for parameters corresponding to particular characteristics of the scanning sequence and the resulting MR images. An image is derived from many repetitions of the pulse sequence, where small changes are typically introduced in the phase encoding gradient of the pulse sequence parameters between repetitions to provide additional spatial encoding. Other changes to the pulse sequences may be introduced, as well. Typical parameters defined by the pulse sequence include TR time, TE time, alignment of the slice axis, slice thickness, slice location, field of view, oblique angle and resolution.

Typically, the operation of the MRI system is controlled by an MR technologist outside the scanning room. The technologist sits at a console with a monitor and uses a mouse or keyboard to click on or type in a limited set of options in a menu driven program. The technologist may select a particular predetermined pulse sequence or may select values for particular parameter of the pulse sequence from a list, based on the portion of the body to be scanned and the instructions of a doctor. When one scanning sequence or series of scanning sequences is completed, the technologist can enter a pulse sequence for another scanning sequence that can then be initiated.

However, it can take many minutes for a technologist to set up a scanning sequence. If used during surgery, the surgeon must communicate with the technician in a separate room to request a particular scanning sequence. The surgeon must then wait for the scanning sequence to be set up by the technologist, conducted and processed to yield an image. This can be a time-consuming, inefficient process. Many minutes may elapse before the surgeon has the needed image.

In U.S. Pat. No. 6,400,157 B1, assigned to the assignee of the present invention and incorporated by reference herein, a hand operated input device, such as a mouse, is used to change the value of parameters of a pulse sequence of an MRI scanning procedure to change characteristics of the resulting image. The control buttons on the mouse may be used to select one of several modes of operation of the mouse. Different imaging parameters may be changed in each mode. The use of multiple modes enables a large number of parameters to be varied with a few input portions of the mouse. For example, the values of parameters corresponding to TR time, TE time, slice axis, slice thickness, slice location, field of view, oblique angle and resolution may all be controlled through a mouse with three control buttons and a roller ball, through selection of particular buttons and movement of the mouse. The mouse may be operated by a surgeon, or other medical personnel to conduct MRI with the desired parameters during a medical procedure. The oblique angle of the image slice may be changed after entering an oblique angle mode by moving the mouse to the right or left to cause a corresponding rotation of the oblique angle of the image slice about an axis, to the right or left. A slice cursor can also be dragged by the mouse to a desired oblique angle.

MRI can be of great benefit during a surgical procedure to locate diseased tissue and to provide current images of the site of the procedure to the surgeon. Presently, however, MRI has been used predominantly for pre-operative and post-operative imaging. MRI has had limited surgical use including MRI-guided fine-needle aspiration cytology and MRI-guided stereotactic, neurosurgery. MRI can also be used to follow and guide the advance of instruments, such as catheters, to a site of interest, for example, U.S. Pat. No. 5,647,361, assigned to the assignee of the present invention.

MRI systems are available with imaging volumes large enough to conduct surgery. The magnet of the MRI system may be large enough to contain an entire surgical team. U.S. Pat. No. 6,201,394 B1, which issued on Mar. 31, 2001 from U.S. Ser. No. 08/975,913, which was filed on Nov. 21, 1997, discloses an MRI system wherein a surgical procedure may be performed within the imaging volume of the system. The system disclosed can encompass part of or an entire room. U.S. Pat. No. 6,023,165, which issued on Feb. 8, 2001 from U.S. Ser. No. 07/993,072, filed on Dec. 18, 1992, also discloses open MRI systems appropriate for conducting surgical procedures. U.S. Pat. No. 6,201,394 B1 and U.S. Pat. No. 6,023,165 are assigned to the assignee of the present invention and are incorporated by reference herein. The Quad 7000 and Quad 12000 Open MRI systems available from the FONAR Corporation, Melville, N.Y., are suitable for performing surgery and other medical procedures, as well.

When an abnormal region of biological tissue, such as a tumor, is discovered by non-invasive means, a diagnosis of the condition of the tissue is typically required in order to determine the appropriate treatment. This requires that an adequate sample of tissue be removed from the patient for histopathological analysis. Common methods for obtaining tissue samples include fine needle aspiration biopsy and large needle core biopsy.

To accurately advance the needle to the site of interest through body tissue, it would be advantageous for the surgeon to be able to see the entire length of the needle within the tissue, through an imaging modality. It has been proposed to guide surgical procedures by magnetic resource imaging ("MRI"). See, for example, U.S. Pat. No. 5,647,361 assigned to the assignee of the present invention. For MRI to assist a surgeon in guiding the needle to the site of interest through body tissue, it would be advantageous to be able to align the orientation of the image slice with the orientation of the needle so that the axis of the needle lies in the plane of the MRI image.

It has been proposed to map the coordinates of the needle by optical feedback, feed the coordinates to an MRI system and cause the slice to be aligned with the axis of the needle based on those coordinates. Such a procedure is complex.

SUMMARY OF THE INVENTION

In one embodiment, the present invention is a hand operated device that provides a rotatable planar member, such as a plate, corresponding to a virtual slice plane of a magnetic resonance image. The planar member may be manipulated by an operator, such as a surgeon, in a room where a medical procedure is taking place under the guidance of magnetic resonance imaging ("MRI"), to change the oblique angle of the current MR image. Other characteristics of the image may be changed, as well.

In accordance with one embodiment of the invention, a hand operated device to control an image characteristic of an imaging scan is disclosed comprising a base and a planar member rotatably coupled to the base. Rotation of the planar member changes an image characteristic, such as the oblique angle of the image.

In accordance with another embodiment of the invention, a hand operated device to control an image characteristic of an imaging scan is disclosed comprising a base, a planar member and a coupling member having a first end coupled to the base and a second end rotatably coupled to the planar member. Rotation of the planar member changes the image characteristic. Rotation of the planar member may change the oblique angle of the image, for example. At least one sensor may be provided proximate a rotatable coupling between the coupling member and the planar member to detect rotation of the planar member.

The coupling member may be a longitudinal member having first end coupled to the base and a second end rotatably coupled to the planar member. The longitudinal member may be telescoping to change a second imaging parameter, such as slice depth, for example. The planar member may comprise at least one displaceable member to change another image characteristic, such as the alignment of the slice axis of the image. The at least one displaceable member may comprise first, second and third buttons to align the slice axis with a coronal, sagittal and axial plane, respectively. Other image characteristics may be changed along with or instead of these image characteristics. The coupling member may be part of the base.

In accordance with another embodiment of the invention, a hand operated device to control a characteristic of an image slice of a magnetic resonance image is disclosed comprising a base, a planar member and a telescoping longitudinal member. The longitudinal member has a first end coupled to the base and a second end having a rounded surface. A recess is defined in a surface of the planar member to receive the rounded surface. At least one sensor is proximate the rounded surface detect rotation of the planar member. At least one displaceable member is coupled to the planar member. Rotation of the plate about the longitudinal member changes a first image characteristic, telescoping of the longitudinal member changes a second image characteristic and displacement of the displaceable member changes a third image characteristic. The first image characteristic may be the oblique angle of the image slice, the second image characteristic may be the depth of the image slice and the third image characteristic may be the alignment of a slice axis.

In accordance with another embodiment of the invention, a hand operated device for changing an image characteristic of an imaging scan is disclosed comprising a base and a telescoping longitudinal member, wherein movement of the telescoping member changes a characteristic of the imaging scan.

A magnetic resonance imaging ("MRI") system is also disclosed comprising a computer to control operation of the system and the hand operated device described above, coupled to the computer to provide input signals to the computer. The computer is programmed to change a characteristic of a magnetic resonance image, such as oblique angle of the image, based on rotation of the planar member about the longitudinal member. For example, the computer may be programmed to change an oblique angle of the image based on rotation of the planar member. A longitudinal member may be telescoping and the computer may be programmed to change a second characteristic of the magnetic resonance image based on telescoping movement of the longitudinal member, such as slice depth. The planar member may further comprise at least one displaceable member and the computer may be programmed to change another characteristic of the magnetic resonance image based on displacement of the at least one displaceable member, such as the alignment of the slice axis.

A method of conducting magnetic resonance imaging procedure is also disclosed comprising conducting a magnetic resonance imaging scan to obtain an image, changing an oblique angle of the first image from a first oblique angle to a second oblique angle by rotating a planar member and conducting a magnetic resonance imaging scan of the second oblique angle to obtain a subsequent image. The method may further comprise conducting a magnetic resonance imaging scan to obtain a magnetic resonance image at a first slice depth, changing the slice depth of the first image by telescoping a longitudinal member rotatably coupled the planar member and conducting a magnetic resonance imaging scan of the second slice depth. The method may also further comprise conducting a magnetic resonance imaging scan to obtain a magnetic resonance image having a slice axis aligned with a first plane, changing the alignment of the slice axis to a second plane and conducting a magnetic resonance imaging scan along the second plane.

BRIEF DESCRIPTION OF THE DRAWINGS

FIGS. 9, 10 and 11 are examples of slice cursors that may be used to indicate the oblique angle of the image slice;

DETAILED DESCRIPTION OF THE PREFERRED EMBODIMENTS

Figure 1:
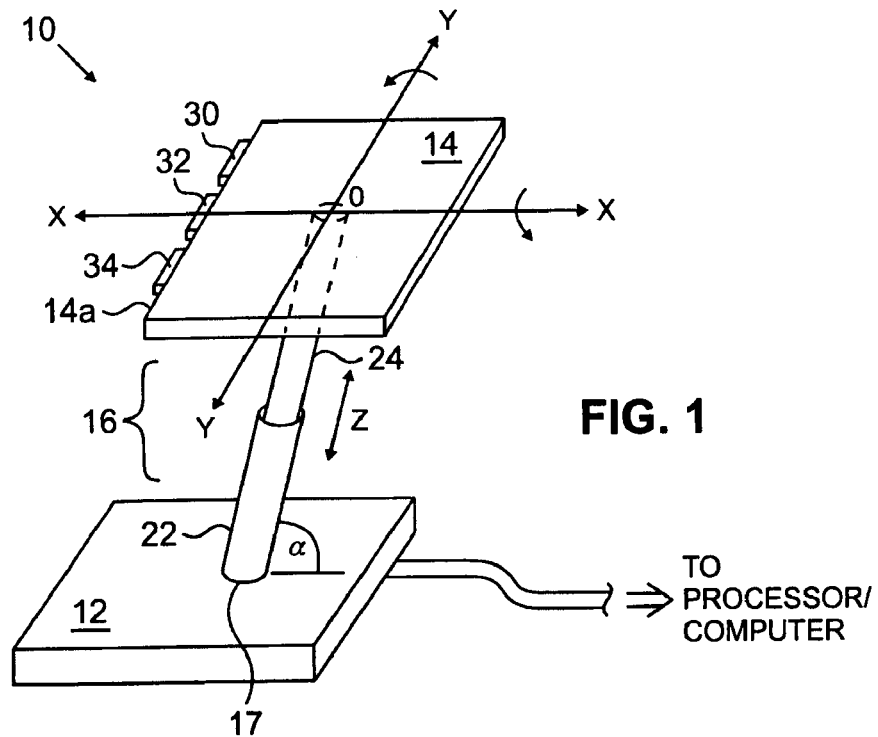
FIG. 1 is a perspective view of a hand operated device for controlling slice orientation and optionally other characteristics of an MR image, in accordance with one embodiment of the invention.

FIG. 1 is a perspective view of a hand operated device 10 for controlling slice orientation and optionally other characteristics of an MR image, in accordance with one embodiment of the invention. The hand operated device 10 comprises a base 12, a planar member 14, such as a flat plate, and a coupling member 16, which may be a longitudinal member, coupling the base to the plate. An x-axis and a y-axis are defined parallel to a plane of the base 12, with an origin O at the center of the plate 14. The longitudinal member 16 has a first end 17 rigidly mounted to the base 12. The longitudinal member 16 may extend from the base 12 at an angle θ which may be any desired angle. The angle θ may be any angle, including 90 degrees.

Figure 3:
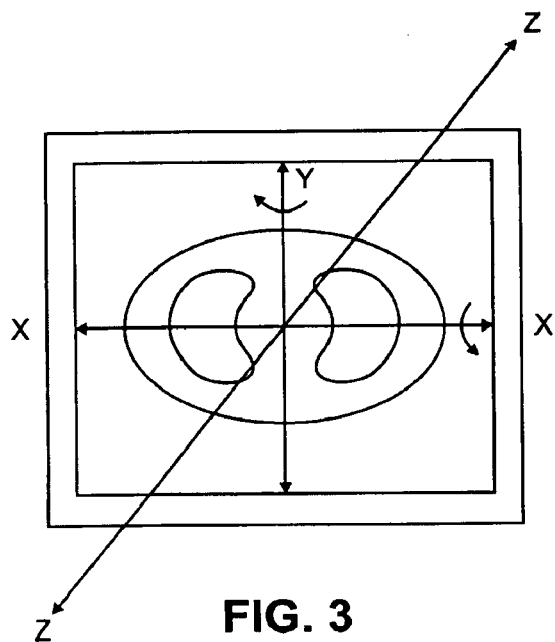
FIG. 3 is an example of an image with x- and y-axes corresponding to x- and y-axes in FIG. 1.
Figure 2:
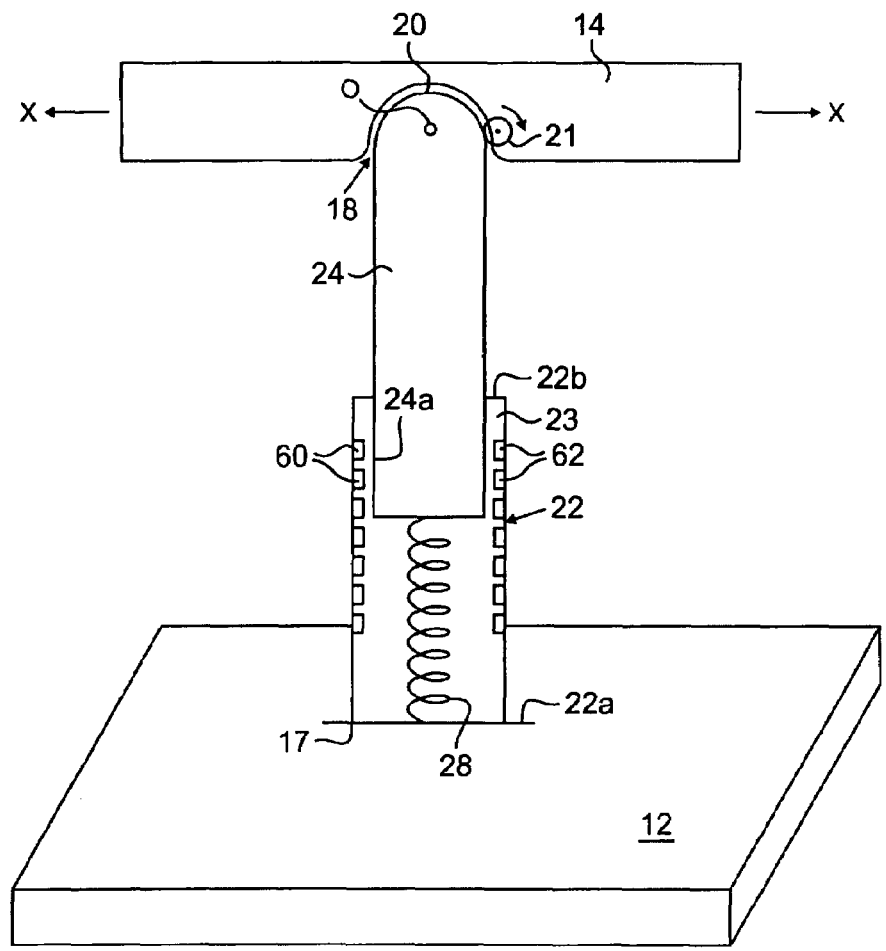
FIG. 2 is a cross sectional view of the hand operated device of the invention, along the x-axis in FIG. 1.

FIG. 2 is a cross sectional view of the plate 14 along the x-axis in FIG. 1, showing a second end 19 of the longitudinal member 16. In this embodiment, the second end 18 is rounded. The shape of the rounded end may be semi-circular. The rounded end 18 is received within a recess 20 in the underside of the plate 14. The recess 20 may be at the center of the plate 14. The semi-circular rounded end 18 may lie on an imaginary circle having a center corresponding to an original O of the x-axis and the y-axis. The plate 14 may be rotated about the ball 18 with respect to the x-axis and a y-axis, as shown in FIG. 1. Rotation of the plate 14 causes a corresponding rotation of the slice orientation of the image about the x- and y-axes, as indicated in FIG. 3 and described further below. The plate 14 may be rotated over a range of about forty-five (45) degrees about the x- and y-axes, to cause corresponding rotations of the oblique angle of the image slice.

Figure 4:
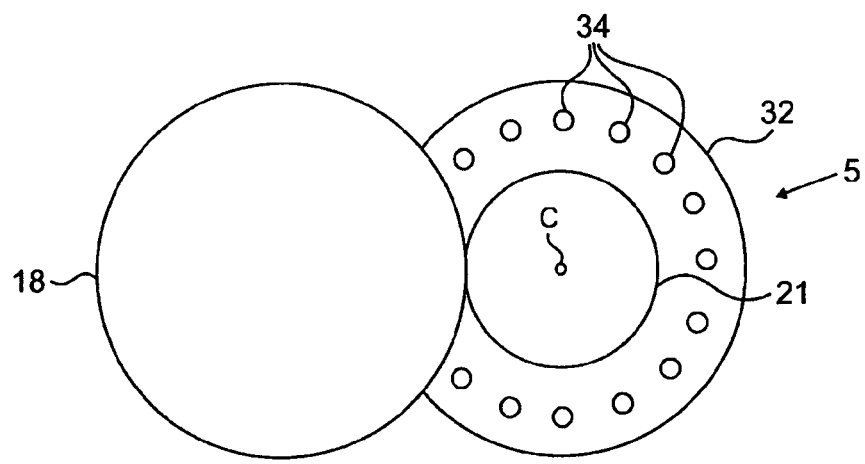
FIG. 4 is a front view of a detection system for detecting rotation of the plate of the hand operated device of FIG. 1.

Rotation of the plate 14 about the rounded end 18 may be detected by detectors, as is known in the art. For example, a detecting scheme used in a computer mouse for detecting rotation of the ball on the underside of the mouse with movement of the mouse, may be used. In one embodiment of the invention, a first wheel or rod 21 is rotatably supported by the plate 14 along the x-axis, as shown in FIG. 3. The wheel 21 extends partially within the recess 20, bearing against the rounded end 18. FIG. 4 is a front view of the first rotatable wheel 21 bearing against the rounded end 18. The first wheel 21 is coupled to a disk 32 such that rotation of the wheel causes rotation of the disk. A plurality of openings 34 are defined through the disk 32. The openings are positioned equidistantly from a center C of the disk 32. While the disk 32 preferably has a shape of a circle, that is not required. The plate 14, the recess 20 and the longitudinal member 16 are not shown in FIG. 4 to simplify the illustration.

Figure 5:
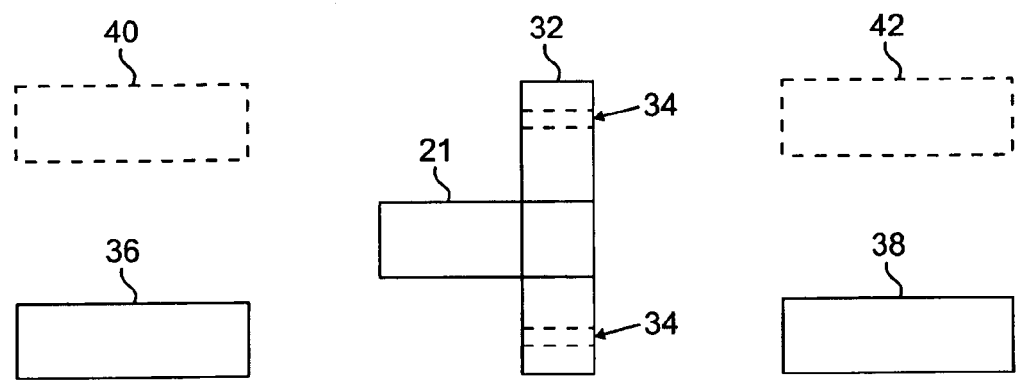
FIG. 5 is a side view of a detection system along arrow 5 in FIG. 4.

FIG. 5 is a side view of the disk 32 and the rotatable wheel 21 along arrow 5 in FIG. 4. Two openings 34 through the wheel 21 are shown in phantom. The rounded end 18 is not shown to simplify the illustration. A light source 36, such as a light emitting diode ("LED"), may be mounted on one side of the disk 32, aligned with one of the openings 34. A light sensitive detector 38 may be mounted on an opposite side of the disk 32, aligned with the source 36. A second light source 40 and a second light sensitive detector 42 may be provided for greater reliability, as shown in phantom in FIG. 5. In FIG. 5, the second light source 40 and the second light sensitive detector 42 are on an opposite side of the disk 32 as the first light source 36 and the first light sensitive detector 38. They may be positioned in other locations, as well.

Rotation of the plate 14 along the y-axis, which comes out of the page in FIG. 2, causes rotation of the wheel 21 and the disk 32. Light emitted by the light source 36 is alternately intercepted by the disk 32 or allowed to pass through one of the openings 34. The detector 38 detects the light passing through the openings 34. A second rotatable wheel and detection system having a similar design as described with respect to the first rotatable wheel 21 and the detection system shown in FIGS. 3, 4 and 5, may be similarly mounted along the y-axis to detect rotation of the plate 14 about the x-axis.

The number of detected light pulses is indicative of the degree of rotation of the plate 14 with respect to the x- and y-axes. The detectors 38 are electrically or electromagnetically coupled to signal processing circuitry and a processor, such as a computer, that is programmed to determine the orientation of the plate 14 in space. The computer that controls the operation of the MRI system, which is discussed further below, may serve as the processor. The processor may be a separate device coupled to the computer, as well. Knowing the initial position of the plate 14, the processor may determine the orientation of the plate 14 by comparison of the signals received from the detectors to a look up table stored in a memory, for example. The processor may be programmed to determine the orientation of the plate 14 by direct calculation as well, based on the initial position of the plate 14 and the signals received from the detectors indicative of the rotation of the plate.

Rotation of the wheels 21 due to movement of the plate 14 may also be detected by other types of sensors, as well.

Figure 6:
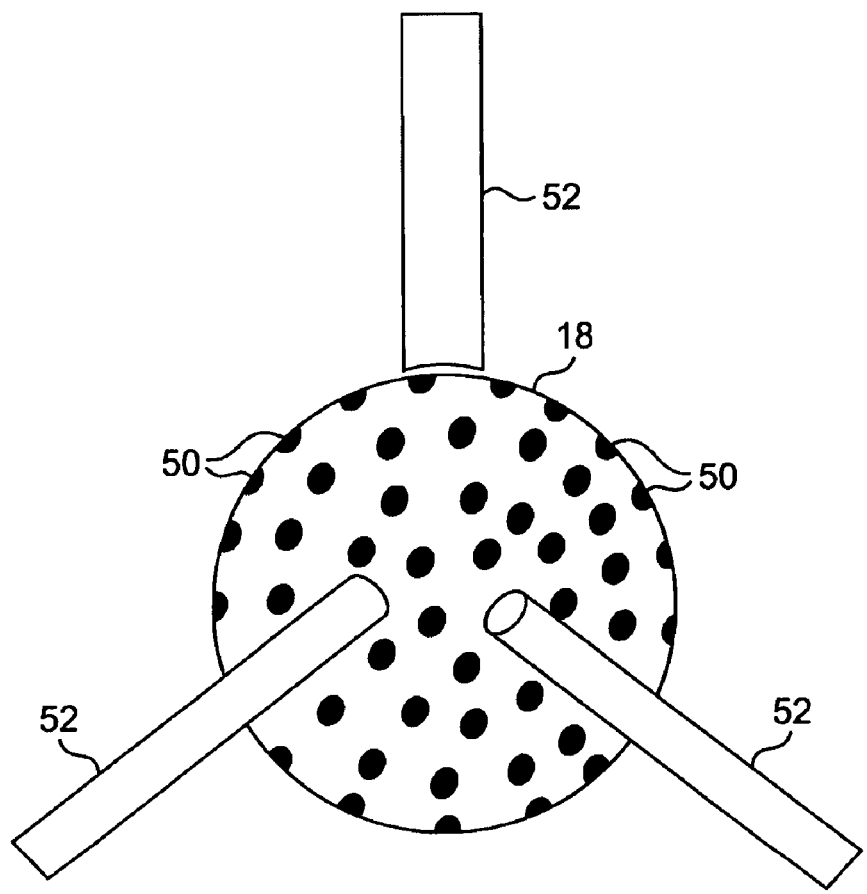
FIG. 6 is another example of a detection system to detect rotation of the plate.

FIG. 6 shows another example of a detection system to detect rotation of the plate 14 about the rounded end 18. The rounded end 18 includes a plurality of indicators, such as black dots 50. A plurality of optical sensors 52 are positioned around the rounded end 18 to receive light from light portions of the ball 18. Three sensors 52 are shown in FIG. 6. The alternating reception of light from the uncolored portions of the rounded end 18 is indicative of rotation of the plate 14. As above, the processor can be programmed to determine the orientation of the plate 14, based on the signals received from the sensors 52 and the initial position of the plate 14 and the ball 18, by comparison to a look up table or direct calculation, for example.

The degree of rotation of the plate 14 will preferably cause a corresponding change in the oblique angle of the slice image. For example, rotating the plate 14 forty-five (45) degrees in the clockwise direction about the x-axis in FIG. 1 will cause the oblique angle of the slice image to rotate 45 degrees about the x-axis in a clockwise direction, as well. Since the plate 14 is a planar, physical object, it is believed that an operator of the device 10 will be able to readily visualize and acquire the desired oblique angle in the slice image by rotating the plate 14 in space to the desired angle.

Returning to FIG. 1, the longitudinal member 16 is preferably telescoping, in order to control another characteristic of the slice image, such as the depth of the slice image. The longitudinal member 16 may comprise a first, lower longitudinal member 22 with the first end 17 connected to the base 12, as shown in FIG. 2. The first longitudinal member 22 defines an interior hollow region 23 with an open second end 22b for receiving a first end 24a of a second, upper longitudinal member 24. The plate 14 is rotatably coupled to the second end 19 of the second longitudinal member 24, as discussed above. The upper longitudinal member 24 may define the interior hollow region to receive the lower longitudinal member 22, as well.

The size of the plate 14 may be such that the operator may grip the exterior edges of the plate. The second longitudinal member 24 may thereby be depressed into and retracted from the first longitudinal member 22 by movement of the operator's hand, to move the slice plane along the Z axis deeper into or less deep into the subject than the current image. (See FIGS. 1 and 3). If the plate 14 is too large to grip, openings may be provided through the plate 14, for insertion of the operator's fingers, as discussed further below with respect to FIG. 12. Cavities or straps may be provided in the top surface of the plate 14 to secure the fingers or hand of the operator, as well. The term "telescoping" encompasses both the depression and the retraction of the plate 14 with respect to the base 12, along the axis of the longitudinal members 22, 24. Movement along the axis of the longitudinal members 22, 24 corresponds to movement along the Z axis of the patient.

A spring 28 may be provided within the interior hollow region 23 with one end bearing against an end of the second longitudinal member 24, to provide a force on the member in a direction out of the interior hollow region. A plurality of position detectors may be provided along the inter wall of the interior hollow region to detect the position of the second longitudinal member. The position detectors may comprise one or more vertical rows of light sources 60, such as LEDs on one side of the interior hollow region 23 and one or more corresponding vertical rows of light sensitive detectors 62, opposing each vertical row of sources. As the plate 14 is depressed into the interior hollow region 23, more light detectors 62 are blocked from reception of light by the second longitudinal member 24. As the plate 14 is retracted, more light detectors are able to detect light.

Alternatively, wheels (not shown) may be provided along an inner wall of the interior hollow region 23, bearing against the second member 24. Rotation of the wheels as the second longitudinal member 24 moves in and out of the hollow region may be detected by LEDs, as described above with respect to the wheels 21.

Depression of the plate 14 may also be detected by a pressure sensor (not shown) coupled to the spring 28. If the interior hollow region 23 is sealed, an air pressure detector may be provided within the interior hollow region to detect changes in air pressure as the plate 14 is depressed and retracted.

The processor may be programmed to compare the signals received from any of these sensors to a look up table stored in memory to determine the change in the height of the plate 14, and to correlate the information with a change in a characteristic of the image, as described further below.

One or more displaceable members, such as one or more buttons, may be provided on the plate 14 to vary one or more other characteristics of an image. In the embodiment of FIG. 1, three buttons 30, 32, 34 are provided on the plate 14 to select an alignment of the slice axis of the image, to align the image along the coronal, sagittal or axial planes of the patient, respectively. The buttons 30, 32, 34 may be provided along an edge of the plate 14, such as the forward edge 14a, for example, for activation by one or more fingers of the operator. Each button is electrically or electromagnetically coupled to a computer, such as the computer controlling operation of the MRI system, to select the desired orientation. An initial reference position of the slice along a particular slice axis and the alignment of the slice axis during a procedure may be selected by activating one of the buttons 30, 32, 34.

More or fewer buttons may be provided to vary the slice axis. For example, slice axis may be varied through one button, by designating a predetermined number of clicks to each axis. For example, one click can designate the coronal plane, two clicks the sagittal plane and three clicks the axial plane.

Figure 7:
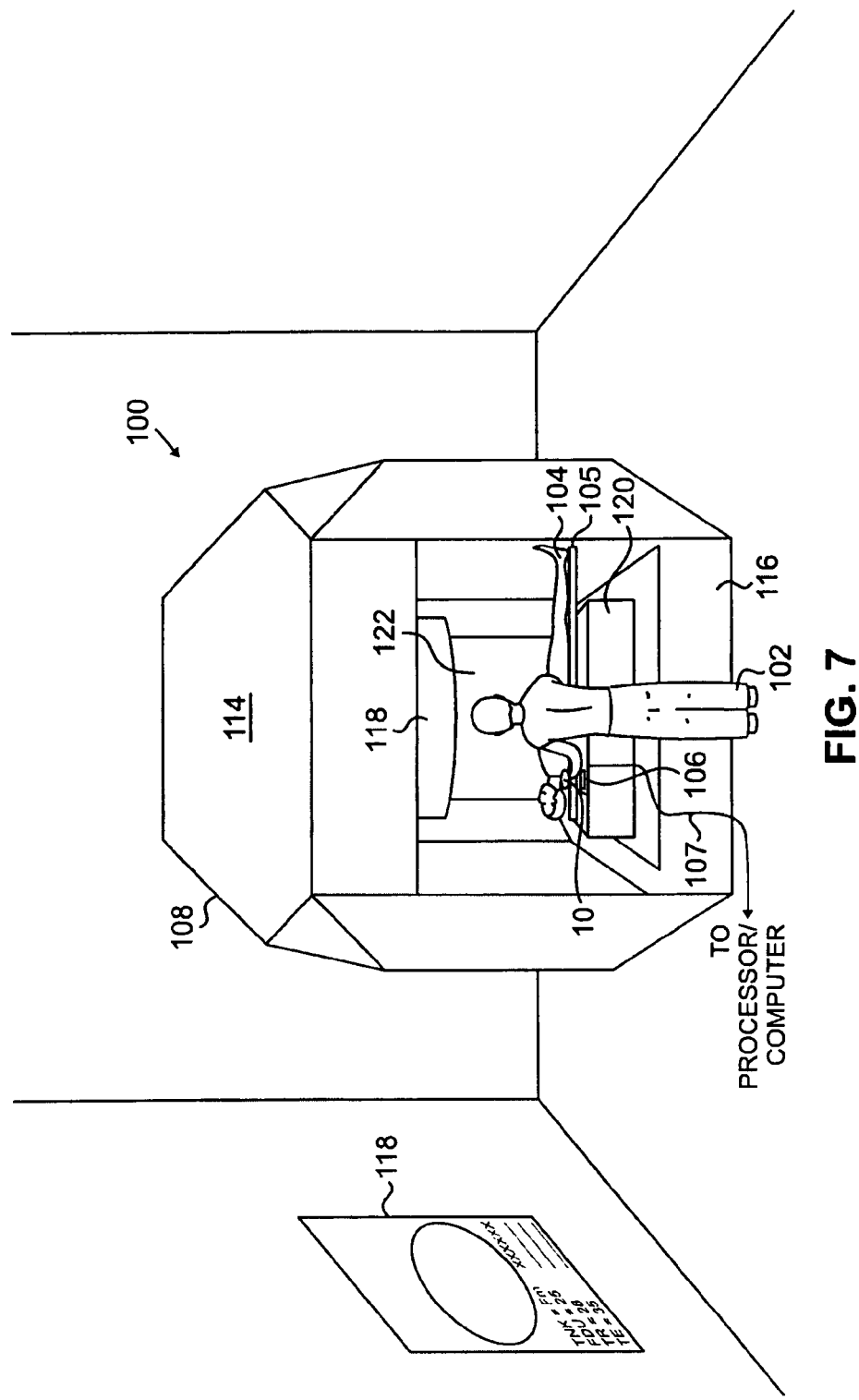
FIG. 7 is a view of an MRI system in accordance with an embodiment of the present invention.

FIG. 7 is a view of an MRI system 100 in accordance with an embodiment of the present invention, including a surgeon or other medical personnel 102 conducting a medical procedure on a patient 104 lying on a bed 105. The doctor 102 is shown manipulating the hand operated device 10 of the present invention, described above. The hand operated device 10 is supported by a table 106 next to the surgeon 102 and the patient 104, so that the surgeon or other medical personnel can control the slice orientation, and optionally other image characteristics, such as the slice depth and the axial orientation of MRI images, from MRI scans conducted during a surgical or other type of medical procedure, in accordance with an embodiment of the invention. The hand operated device 10 is electrically connected to a processor or the computer controlling the operation of the MRI system 100 by a wire 107, as discussed above. The device 10 may be electromagnetically coupled to the processor or computer, as well, as discussed further, below.

The MRI system 100 preferably comprises an MRI magnet assembly 108 in an open configuration, facilitating access to the patient 104 by medical personnel to perform a medical procedure; such as surgery. The magnet assembly 108 comprises a frame of ferromagnetic material, typically iron, comprising four side columns, two of which (110, 112) are shown in FIG. 7, connected to opposing pole supports 114, 116. Opposing ferromagnetic poles 118, 120 are supported by the pole supports 114, 116, respectively. An imaging volume 122 is defined between opposing faces of the poles 114, 116. Significant open space is provided, enabling medical personnel, such as the surgeon 102, to have access to the patient 104. A screen 118 may be provided for the projection of the current MRI image, as well as for displaying the current parameters of the scan and characteristics of the image, as described further below. Alternatively, a monitor or super VGA glasses may be used to display the image.

Open MRI systems are known in the art. For example, U.S. Pat. No. 6,201,394 B1 discloses an MRI system wherein a surgical procedure may be performed within the imaging volume of the system. The system disclosed can encompass part of or an entire room. U.S. Pat. No. 6,023,165 also discloses open MRI systems appropriate for conducting surgical procedures. U.S. Pat. No. 6,201,394 B1 and U.S. Pat. No. 6,023,165 are assigned to the assignee of the present invention and are incorporated by reference herein. The Quad 7000 and Quad 12000, available from FONAR Corporation, Melville, N.Y., are open MRI systems which can also be used in conjunction with medical procedures including surgery.

Figure 8:
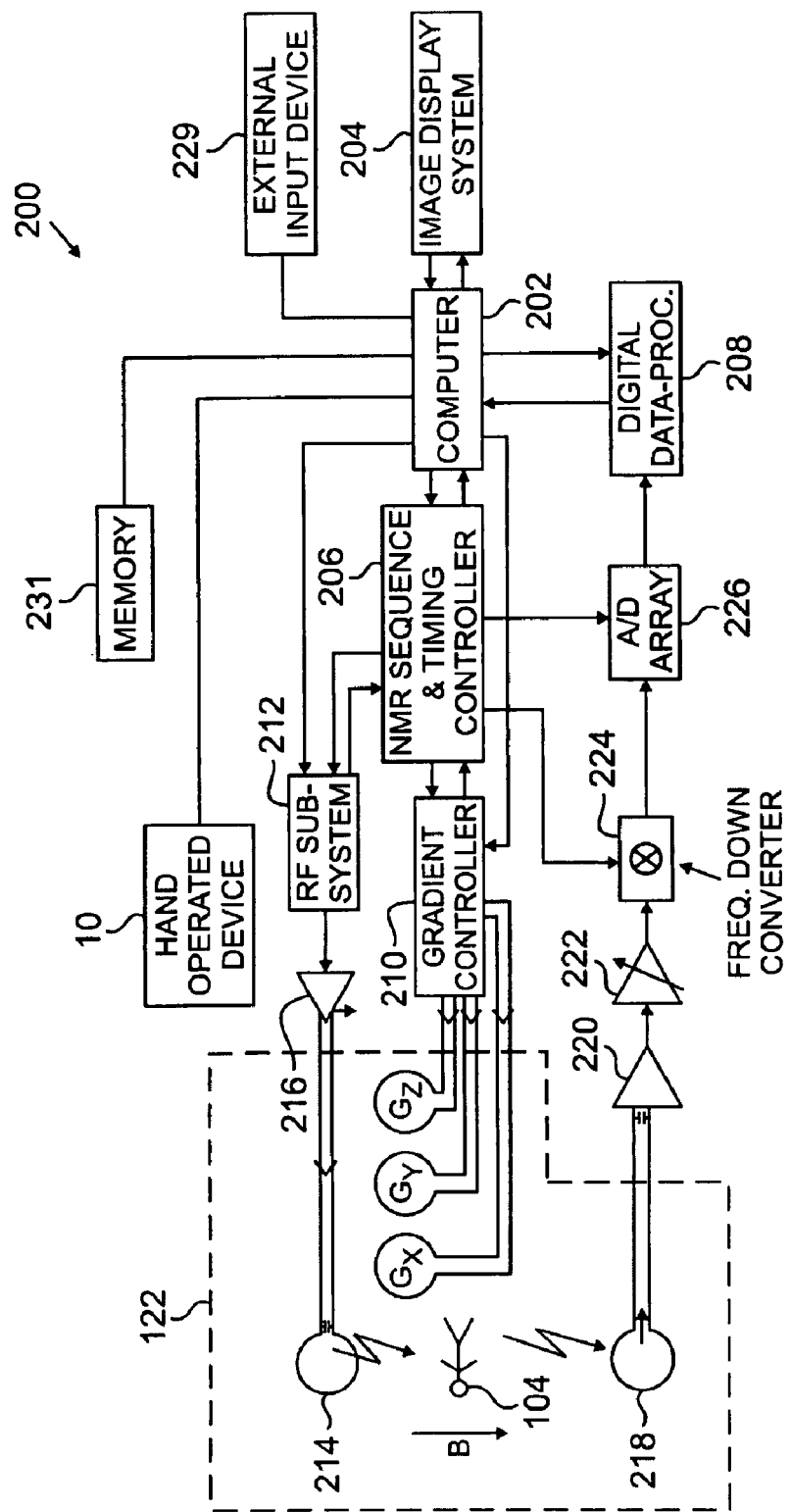
FIG. 8 is a schematic diagram of an MRI system in accordance with an embodiment of the invention.

FIG. 8 is a schematic diagram of an MRI system 200 in accordance with an embodiment of the invention, including a computer 202, an image display system 204, a nuclear magnetic resonance sequence and timing controller ("NMR controller") 206 and a digital data processor 208. The system also includes a gradient controller 210 and a radio frequency transmitter subsystem ("RF subsystem") 212. The RF subsystem 212 includes a transmitting antenna 214 coupled to an amplifier 216.

A receiving coil 218 is also provided, coupled to the digital data processor 208 through a pre-amplifier 220, a variable amplifier 222, a frequency divider or frequency down converter 224 and an analog-to-digital conversion array ("A/D array") 226. The digital data processor 208 is typically coupled to the A/D array 226 through a data bus (not shown). While two separate transmitting and receiving coils 216, 218 are shown, a single coil can both transmit a radio frequency pulse and receive MR signals, as is known in the art.

The imaging volume 122 of the MRI system 100 is indicated. The transmitting coil 214, receiving coil 218 and gradient coils, Gx, Gy, Gz are within the imaging volume 122. Shim coils (not shown), are provided adjacent the poles of the magnet within the imaging volume 122, as is known in the art.

The computer 202 is a real time computer with submicrosecond timing precision. The computer 202 controls the overall operation of the MRI system 200. The computer 202 has outputs connected to inputs of the image display system 204, NMR controller 206, digital processor 208, gradient controller 210, and RF subsystem 212. The computer 202 also has inputs connected to outputs of the image display system 204, NMR controller 206, and digital data processor 208. Predetermined pulse sequences are stored in the computer 202. Different scanning procedures may be provided for different body regions. The computer 202 provides the pulse sequence selected by the operator to the NMR controller 206 for execution.

The hand operated input device 10, which in one embodiment is electrically coupled to the computer 202 along a wire 107, is shown. Alternating or direct current signals may be provided from the device 10 the computer 202 along the wire 107. The hand operated device 10 may also be electromagnetically coupled to the computer 202 by incorporating a transmitter on the device and coupling a receiver (not shown) to the computer 202. An external input device 229 is also coupled to the computer 202. The external input device may a conventional input device, such as a conventional mouse and/or a keyboard, for use by a scanning technologist in another room, so that control of the MRI system 100 may be shared with, or passed to the technologist.

Memory 231 for storing the program implementing the embodiments of the present invention is also shown. The memory may be a magnetic, optical or semiconductor memory device, including, without limitation, read only memory ("ROM"), including DVD ROM, or random access memory ("RAM"), including DVD RAM, flash memory and electrically erasable programmable ROM. (EEPROM). The memory 231 may be the hard drive of a computer 202. The program implementing the invention may be provided on a machine readable medium, such as magnetic or optical memory devices. A CD-ROM may be used, for example. The program may also be downloaded from a server via the Internet.

The NMR controller 206 is a microprocessor based timing controller or other programmable device that stores the pulse sequence provided by the computer 202. A clock (not shown) in the NMR controller 206 synchronizes the entire MRI system 10. The NMR controller 206 has outputs connected to inputs of the gradient controller 210 and RF subsystem 212. The NMR controller 206 also has outputs connected to inputs of the frequency down converter 224 and A/D array 226. The NMR controller 206 has inputs connected to outputs of the gradient controller 210 and RF subsystem 212. The NMR controller 206 may be part of the computer 202.

The gradient controller 210 is a microprocessor, such as a digital signal processor (DSP), which includes a gradient waveform generator (not shown). The gradient controller 210 is connected to gradient coils Gx, Gy, Gz which generate orthogonal linear magnetic fields within the imaging volume 122 along the x-y-z axis, respectively, under the control of the gradient controller 210. The gradient waveform generator contains a waveform stored in digital form and a phase encoding waveform. The magnitudes and directions of the gradient fields to be generated by each coil Gx, Gy, Gz during a particular pulse sequence are provided by the computer 202 to the gradient controller 210, which stores the information. The NMR controller 206 controls the timing of the operation of the gradient controller 210. In response to a pulse or pulses from the NMR controller 206, the gradient controller 210 causes the output of a particular waveform or waveforms for a desired pulse sequence to each of the gradient coils Gx, Gy, Gz, as is known in the art.

When instructed by the computer 202, the NMR controller 206 executes the pulse sequence provided by the computer 202 by providing a synchronization pulse, indicating the start of a scanning procedure, and timing pulses for controlling the operation of the various subsystems, to the A/D array 226, RF subsystem 212 and the gradient controller 210. For example, the NMR controller 206 provides a series of pulses to the A/D array 226 indicating when the A/D array 226 should sample the signal provided by the frequency down converter 224. The NMR controller 206 similarly provides a series of pulses to the RF transmitter subsystem 212 for initiating the injection of radio frequency pulses of particular values, as determined by the pulse sequence, into the imaging volume 122. The NMR controller 206 also controls operation of the gradient controller 210, indicating when the gradient fields should be turned on and off. In this way, the NMR controller 206 and the computer 202 control the execution of a pulse sequence and the implementation of the MR scanning procedure.

Use of the hand operated device 10 in a medial procedure in accordance with an embodiment of the invention will now be described. The MRI system 200 continuously conducts a scanning loop to generate images at an initial pulse sequence, which may be established in a set up mode. The initial pulse sequence may be one in which the images are generated in a short period of time with rapid imaging techniques. Rapid imaging techniques enable the acquisition of multiple image slices as fast as one second or less, as is known in the art. For example, 10 MR images may be acquired and displayed in one second. See, for example, Werhli, Felix, *Fast Scan Magnetic Resonance—Principles and Applications*, Raven Press, New York, N.Y. (1991), which is incorporated by reference, herein. The displayed images are, therefore, provided in real-time or nearly in real-time.

Figure 11:
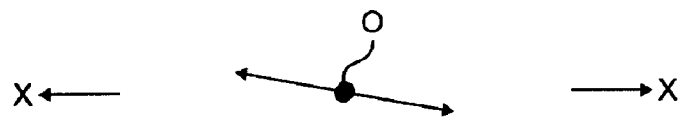

The current orientation of the image slice may be indicated on the screen 118, on a monitor or on VGA glasses by a slice cursor, for example. FIGS. 10 and 11 are examples of pairs of slice cursors that may be used to indicate the oblique angle of the image slice. In FIG. 9, the slice cursor 130 shows the orientation of the image with respect to the x-axis of FIG. 1, which is coming out of the page. The y-axis and the origin O are also shown. The slice cursor 132 shows the orientation of the image with respect to the y-axis of FIG. 1. Again, the x-axis is coming out of the page and the origin is shown. In FIG. 9, the plate 14 is parallel to the base 12 and the oblique angle of the image is neutral.

When it is desired to adjust the oblique angle of the MRI scan, the plate 14 is rotated about the ball 18 to a desired orientation. Movement of the plate 14 to the right or left, and/or forward or back, causes a corresponding rotation of the slice cursor, under the control of the computer 202, based on the inputs provided by the detectors 38, 40 shown in FIG. 5, for example. In FIG. 10, the slice cursor 130 is rotated about 45 degrees about the x-axis, in the clockwise direction, to indicate rotation of the plate 14 45 degrees and the desired oblique angle of 45 degrees about the x-axis. Rotation of the slice cursor 132 to indicate forward or reverse rotation of the plate 14 about the y-axis may be indicated by increasing the size of the arrow in the direction of rotation and decreasing the size of the arrow opposite the direction of rotation. In FIG. 10, the slice cursor 132 is shown with the upper portion 132a thickened, to indicate rotation in the forward direction, and the lower portion thinned, to give a relative indication of the extent of rotation. For a more quantitative indication of the rotation of the plate 14 and the image, the slice cursor 132 may be oriented with the y-axis coming out of the page, as shown in FIG. 11.

Preferably, the oblique angle of the image is updated as quickly as possible. For example, as mentioned above, MR images may be generated in 0.10 seconds. As the oblique angle of the plate 14 is varied continuously from an initial to a final position, the current oblique angle of the MR image may be updated every 0.10 seconds to correspond to the current oblique angle of the plate 14.

The change in oblique angle from one image to the next may appear to take place in real time or nearly in real time.

The MRI system 100 can vary the angle of image acquisition by suitably changing the gradient magnetic fields to define a slice select gradient plane of constant magnetic field at the desired angle, as is known in the art. See, for example, U.S. Pat. No. 4,871,966, assigned to the assignee of the present invention and incorporated by reference herein, in its entirety. The computer 202 creates a new, updated pulse sequence based on the pulse sequence currently being executed, by changing the value of the one or more parameters of the pulse sequence that define the oblique angle of the image slice, based on the inputs provided by the detectors 38, 42 shown in FIG. 5, for example. The updated pulse sequence is then provided to the NMR controller 206. The values of the particular parameters determining the magnitudes and directions of the gradient fields generated during the pulse sequence are also provided to the gradient controller 210. The computer 202 then interrupts execution of the current pulse sequence and causes the NMR controller 206 to execute the updated pulse sequence, implementing the new pulse sequence. As mentioned above, the oblique angle may be varied over a range of plus or minus forty-five (45) degrees about the x-and y-axes. If a change in oblique angle of greater than forty-five (45) degrees is desired, the slice axis may be changed through the buttons 30, 32, 34, for example, and the oblique angle varied with respect to the new slice axis.

As discussed above, three buttons 30, 32, 34 are provided along an edge of the plate 14 to select the orthogonal alignment of the slice axis of the image, as shown in FIG. 1. The orthogonal alignment of an image slice is determined by the orientation of the slice select gradient field with respect to the x-y-z axis in the imaging volume 122. The orientation of the slice select gradient field is controlled by the gradient controller 210 in the MRI system 200. Selection of one of the buttons to change the orthogonal alignment causes the computer 202 to vary the value of the parameter or parameters defining the orthogonal alignment.

As also discussed above, in the embodiment of FIG. 1, the depth of the image slice may also be varied with the hand operated device 10, by depressing or retracting the plate 14 with respect to the base 12. Depression of the plate 14 may increase the depth of the image while retracting the plate may decrease the depth of the image, or vice-a-versa. The depth of the slice is dependent on the frequency of the radio frequency pulse and the gradient fields. To change the depth of the slice, the computer 202 updates the values of the one or more parameters defining the frequency of the radio frequency pulses of the pulse sequence, based on the inputs provided by the detectors 60, 62 in FIG. 2, for example. The new pulse sequence is provided to the NMR controller 206, which updates the magnitudes and directions of the gradient fields to be generated by the gradient controller 210. As above, the MR images may be updated every 0.10 seconds. Instead of controlling the slice depth, the computer 202 may be programmed to correlate depression and retraction of the plate 14 to parameters defining other characteristics of the MR image, such as the slice thickness of the image. Slice thickness may be varied by changing the bandwidth of the radio frequency pulse, as is known in the art. The computer 202 may update the values of the parameter or parameters defining the bandwidth, based on the input provided by the detectors 60, 62 in FIG. 2, for example. The updated pulse sequence is provided to the NMR controller 206, which controls the bandwidth of the radio frequency pulses emitted by the radio frequency transmitting antenna 214 and the timing of the pulses. Depression of the plate 14 towards the base 12 can increment the slice thickness from about 0.5 mm to 10 mm, for example, by varying the radio frequency bandwidth. The particular increments of change of thickness with movement of the device can be established in a set up mode.

As is known in the art, the thickness of an MR image slice can also be varied by changing the magnitude of the slice select gradient field. The computer 202 may therefore be programmed to vary the slice thickness by updating the pulse sequence to generate a different magnitude of the slice select gradient field instead of or along with changing the bandwidth.

Another characteristic that may be controlled through depression and retraction of the plate 14 is field of view. The computer 202 may be programmed such that depression of the plate 14 increases the field of view while retraction of the plate decreases the field of view, or vice-a-versa. The field of view may be changed by varying the sampling period of the A/D array 226 by the NMR controller 206. As above, the computer 202 can update the pulse sequence to change the values of the one or more parameters to define the new field of view based on the inputs provided by the detectors 60, 62 in FIG. 2, for example, and provide the sequence to the NMR controller 206. The desired range of the field of view depends on the body part. The field of view can be increased or decreased at set intervals from about 5 cm to about 50 cm per click, which may also be determined in the set up mode.

The computer 202 may also be programmed to change the field of view by updating the pulse sequence to generate gradient fields of different magnitudes, if desired, instead of or along with changing the sampling period, to change the field of view.

In another alternative, depression and retraction of the plate 14 can be used to vary the image resolution. For example, the computer 202 may be programmed such that depression of the plate 14 increases the resolution and retraction of the plate decreases the resolution, or vice-a-versa. The computer 202 may be programmed to vary resolution by updating the parameters of the pulse sequence defining the sample period and sample frequency. The sample frequency is the number of samples taken within the sample period. The NMR controller 206 controls the sample period and sample frequency through its control of the A/D array 226, under the control of the pulse sequence. The resolution can be increased and decreased in set intervals or continuously while the plate 14 is being depressed or retracted, as desired and established in the set up mode.

Figure 12:
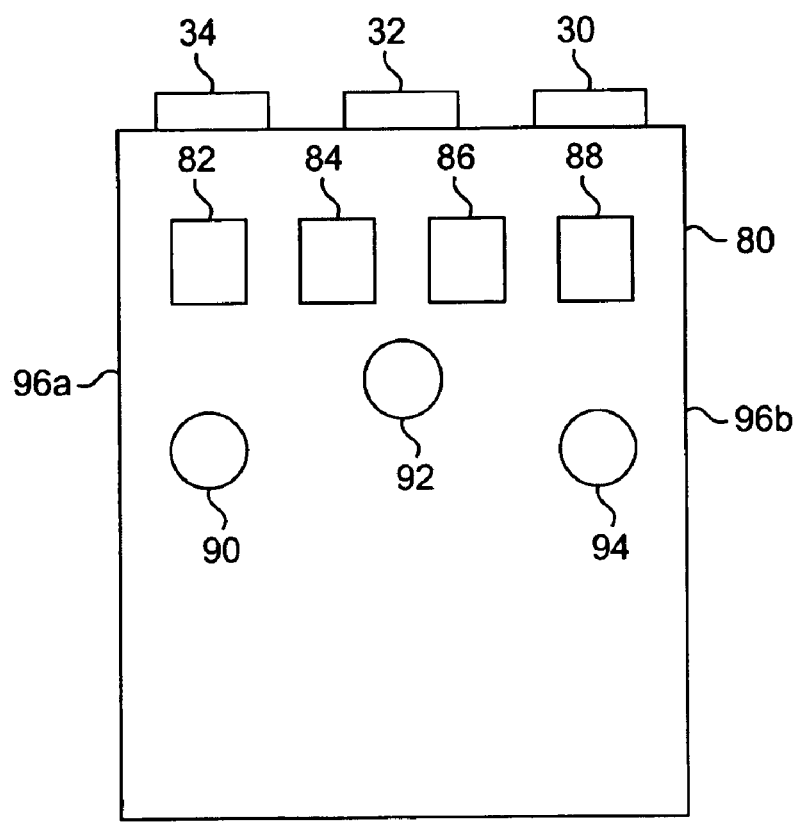
FIG. 12 is a top view of a plate for use with another embodiment of the invention.

In another embodiment, depression and retraction of the plate 14 may control two or more of the image characteristics discussed above, by providing an additional input on the hand operated device 10 to assign a particular characteristic to depression and retraction of the plate 14. For example, FIG. 12 is a top view of a plate 80 including four buttons 82, 84, 86, 88 to select depth of slice, slice thickness, field of view and resolution, respectively. In this embodiment, the computer 202 is programmed to correlate depression/retraction of the plate 80 with the image characteristic corresponding to an activated button 82, 84, 86, 88. After selection of one characteristic, another characteristic may be selected by merely activating another button. Instead of providing one button for each characteristic, a single button may be provided. A different characteristic may be assigned to depression/retraction of the plate 14 by clicking on the button once, twice, three or four times, for example. The buttons 30, 32, 34 for selecting the coronal, sagittal or axial planes, respectively, are shown, as well.

Other characteristics of the MR image may be varied through the buttons 30, 32, 34, as well. For example, field of view, resolution and TR/TE times may be varied with one or more clickable buttons. The field of view and resolution may be varied with two buttons, by assigning one button to increasing the field of view or resolution, and the other button to decreasing the field of view or resolution. The computer 202 may be programmed to change the one or more parameters defining the characteristic as desired, based on clicking of one or the other button. Field of view or resolution may be changed in the manners described above.

TR and TE times can also be varied by assigning one or more buttons to either parameter. For example, four buttons may be provided on the surface of the plate 14 or along the edge. The computer may be programmed such that clicking a first button increases TR time, clicking a second button decreases TR time, clicking a third button increases TE time and clicking a fourth button decreases TE time. Each click may vary the parameter a predetermined amount. TR and TE times are varied by varying the timing parameters in the pulse sequence. Varying TR and TE times is discussed in more detail in U.S. Pat. No. 6,400,157 B1, which is assigned to the assignee of the present invention and incorporated by reference herein.

As above, buttons on the surface of the plate 14 and or along the edge of the plate may control multiple image characteristics by providing a means for designating a mode of operation. For example, an additional button may be provided and the mode assigned to a particular characteristic may be selected by a predetermined number of clicks of the button. Multiple modes of operation are also discussed in U.S. Pat. No. 6,400,157 B1, which is assigned to the assignee of the present invention and incorporated by reference herein.

Also shown in FIG. 12 are openings 90, 92, 94 through the plate 80 for insertion of an operator's fingers, enabled the operator to grip and more easily manipulate the plate. This feature would be particularly useful if the plate 80 is too large for an operator's hand to grab the plate 80 about the side edges 96a, 96b. More or fewer holes may be provided. Alternatively, cavities may be provided in a top surface of the plate 80 or straps may be provided on the plate to secure the operator's hand.

Figure 13:
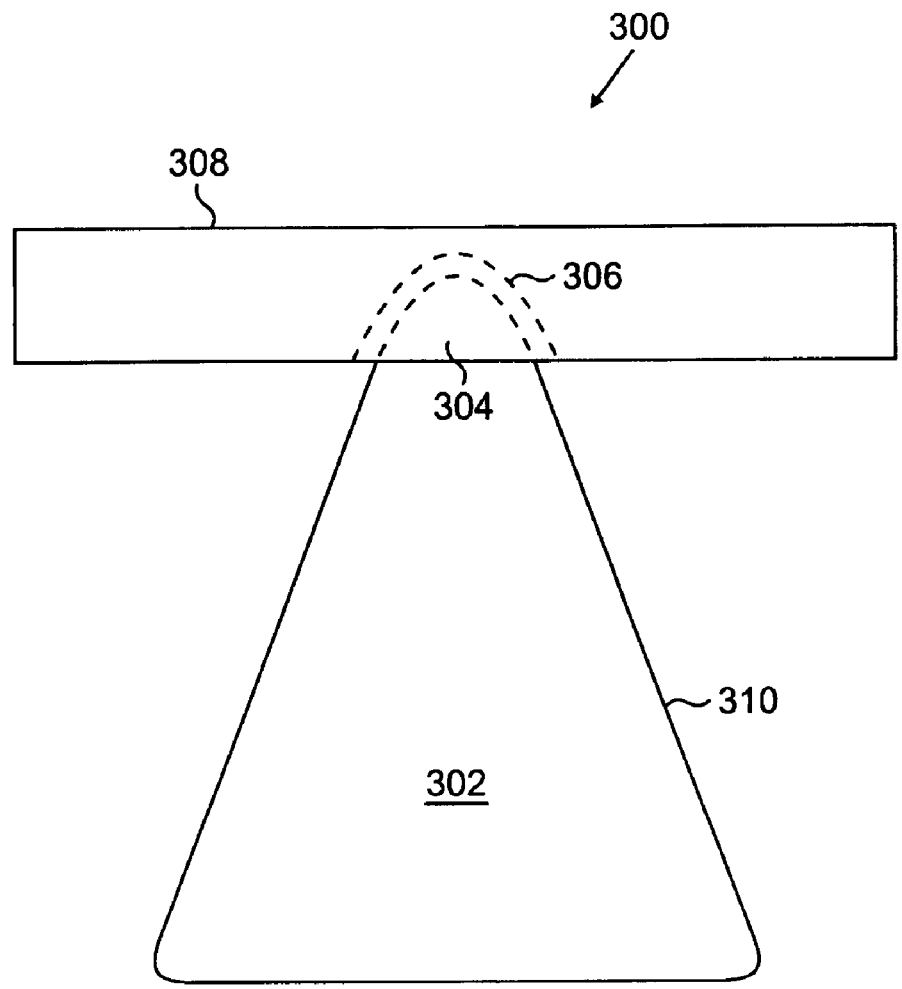
FIG. 13 is a side view of another hand operated device in accordance with an embodiment of the invention.

The coupling member may be part of the base. FIG. 13 is a side view of a hand operated device 300 wherein the base 302 comprises a rounded end 304 that is received within a recess 306 of a planar member 308. The side wall 310 of the base 302 is tapered to facilitate rotation of the planar member 308 to control the oblique angle of an MRI image, or other image characteristics. Rotation of the planar member may be detected by one of the detector arrangements described above, or another detector arrangement. One or more displaceable members (not shown), such as buttons, may be provided to control other image characteristics.

Additional characteristics may be controlled by the hand operated device, as well. The control of the image characteristics described herein, and other image characteristics, by a hand operated device is also described in U.S. Pat. No. 6,400,157 B1, assigned to the assignee of the present invention and incorporated by reference herein.

A doctor, such as a surgeon, or other personnel participating in a medical procedure, may thereby locally control the MRI system 10 based on the progress and needs of the procedure. For example, in a needle biopsy procedure, the oblique angle and depth of the slice may be changed as the procedure progresses, to maintain the entire needle in the image.

The updated pulse sequence can be formed and images obtained in accordance with the updated pulse sequence in real-time or nearly real-time. Since the updated sequence is being formed while the current pulse sequence is being implemented, there may be no perceptible delay between implementation of the current scanning procedure and the new scanning procedure based on the updated scanning sequence. Scanning may therefore continue essentially continuously.

Alternatively, implementation of the scanning procedure in accordance with the updated scanning sequence can commence immediately after the prior scanning sequence is completed or when a new image is desired.

The present invention may also be useful outside of the context of performing surgery or other medical procedures while conducting the MRI procedure, wherever it would be desirable to rapidly change an image characteristic. For example, the hand operated device of the present invention may be used by a technologist to vary the oblique angle, depth of slice and orthogonal alignment during a standard MRI procedure.

In addition, the hand operated device may be useful to control image characteristics in other imaging modalities, such as ultrasound imaging.

Also, while the plates 14, 80 are shown to be rectangular, the plates may be other shapes, as well. For example, the plates 14, 80 may be oval shaped.

While a preferred embodiment is described above, one skilled in the art will recognize that variations may be introduced without going beyond the scope of the present invention, which is defined in the following claims.

We claim:

1. A table top hand operated device to control an image characteristic of an imaging scan, the device comprising:
    a base having a bottom surface to be supported by a table;
    a hand sized planar member;
    a longitudinally extending coupling member having a first end coupled to the base and a second end;
    a rotatable coupling between the second end of the coupling member and the planar member;
    wherein the rotatable coupling comprises light and dark regions; and
    at least one sensor proximate the rotatable coupling to detect relative movement between the sensor and the light and dark regions;
    whereby rotation of the planar member changes the image characteristic.

2. The device of claim 1, wherein rotation of the planar member changes the oblique angle of the image.

3. The device of claim 1, wherein the rotatable coupling further comprises:
    a rounded surface at the second end of the coupling member; and
    a recess defined in a surface of the planar member to receive the rounded surface.

4. The device of claim 3, wherein the at least one sensor is coupled to the planar member, proximate to the recess.

5. The device of claim 4, wherein the dark regions comprise dark marks on the rounded surface and the at least one sensor detects the dark marks as the sensor moves with respect to the rounded surface.

6. The device of claim 5, wherein the dark marks comprise dark dots.

7. The device of claim 1, wherein the longitudinal member is telescoping and telescoping movement of the longitudinal member changes a second image characteristic.

8. The device of claim 7, wherein the second image characteristic is chosen from the group consisting of depth of slice, slice thickness, field of view and resolution.

9. The device of claim 7, wherein the longitudinal member comprises a first longitudinal member coupled to the base and a second longitudinal member rotatably coupled to the planar member, wherein one of the first and second longitudinal members has a recess to movably receive the other longitudinal member.

10. The device of claim 9, further comprising at least one sensor within the recess of the one longitudinal member to detect movement of the other longitudinal member.

11. The device of claim 1, wherein the planar member comprises at least one displaceable member to change a second imaging characteristic of the imaging scan.

12. The device of claim 11, wherein the second image characteristic is alignment of an image slice axis.

13. The device of claim 12, wherein the at least one displaceable member comprises first, second and third buttons to establish a slice axis to align an image with a with a coronal, sagittal and axial plane of the subject, respectively.

14. The device of claim 12, wherein the second imaging parameter is chosen from the group consisting of field of view, resolution and TR/TE times.

15. The device of claim 1, wherein the planar member is a plate.

16. The device of claim 15, further comprising means for gripping the plate.

17. The device of claim 1, wherein the coupling member is part of the base.

18. A table top hand operated device to control a characteristic of an image slice of a magnetic resonance image, comprising:
    a base having a bottom surface to be supported by a table;
    a hand sized planar member; and
    a telescoping longitudinal member having a first end directly and rigidly mounted to the base and a second end having a rounded surface;
    a recess defined in a surface of the planar member to receive the rounded surface;
    at least one sensor proximate the rounded surface to detect rotation of the planar member; and
    at least one displaceable member coupled to the planar member;
    wherein:
    rotation of the planar member about the longitudinal member changes a first image characteristic;
    telescoping of the longitudinal member changes a second image characteristic; and
    displacement of the displaceable member changes a third image characteristic.

19. The device of claim 18, further comprising:
    a rotatable coupling between the second end of the coupling member and the planar member; and
    at least one sensor proximate the rotatable coupling to detect rotation of the planar member.

20. The device of claim 19, wherein the sensor comprises:
    a rotatable member bearing against a circular member such that rotation of the planar member with respect to the circular member causes rotation of the circular member
    means for detecting rotation of the rotatable member.

21. The device of claim 20, wherein:
    the rotatable member defines a plurality of openings; and
    the means comprises a source of light on one side of the rotatable member and a light sensitive detector on an opposite side of the rotatable member to detect light passing through one of the plurality of openings as the rotatable member is rotated.

22. The device of claim 20, wherein the rounded surface has a plurality of indicators and the at least one sensor is sensitive to relative movement between the indicator and the sensor.

23. The device of claim 18, wherein the first image characteristic is oblique angle of the image slice.

24. The device of claim 18, wherein the second image characteristic is depth of the image slice.

25. The device of claim 18, wherein the third image characteristic is alignment of a slice axis.

26. The device of claim 18, wherein the at least one displaceable member comprises first, second and third buttons to designate a coronal, a sagittal and an axial plane of a subject as a plane of an image, respectively.

27. A hand operated device for changing an image characteristic of an imaging scan, the device comprising:
    a base; and a telescoping longitudinal member having an end coupled to the base;
wherein movement of the telescoping member changes a characteristic of the imaging scan chosen from the group consisting of slice thickness, size of field of view and resolution.

28. The device of claim 27, further comprising:
a planar member;
wherein the telescoping member has a second end rotatably coupled directly to the planar member.

29. A magnetic resonance imaging ("MRI") system, comprising:
a computer to control operation of the system;
a table; and
a hand operated device coupled to the computer to provide input signals to the computer, the hand operated device comprising:
a base having a bottom surface supported by a table;
a hand sized planar member; and
a longitudinally extending coupling member having a first end coupled directly and rigidly to the base and a second end rotatably coupled directly to the planar member;
wherein the computer is programmed to change a characteristic of a magnetic resonance image based on rotation of the planar member.

30. The MRI system of claim 29, wherein:
the longitudinal member is telescoping; and
the computer is programmed to change a second characteristic of the magnetic resonance image based on telescoping movement of the longitudinal member.

31. The MRI system of claim 30, wherein the computer is programmed to change slice depth based on telescoping movement of the longitudinal member.

32. The MRI system of claim 29, wherein:
the planar member further comprises at least one displaceable member; and
the computer is programmed to change a second characteristic of the magnetic resonance image based on displacement of the at least one displaceable member.

33. The MRI system of claim 32, wherein:
the computer is programmed to change an alignment of a slice axis of the magnetic resonance image based on displacement of the at least one displaceable member.

34. The MRI system of claim 33, wherein:
the at least one displaceable member comprises first, second and third buttons; and
the computer is programmed to:
change the alignment of the slice axis so that an image is aligned with the coronal plane when the first button is selected:
change the alignment of the slice axis so that an image is aligned with the sagittal plane when the second button is selected; and
change the alignment of the slice axis so that an image is aligned with the axial plane when the third button is selected.

35. The MRI system of claim 29, wherein the coupling member is part of the base.

36. The MRI system of claim 29, further comprising a wire to couple the hand operated device to the computer.

37. The MRI system of claim 29, wherein the hand operated device is electromagnetically coupled to the computer.

38. The MRI system of claim 29, wherein the computer is programmed to change an oblique angle of the image based on rotation of the planar member.

39. A hand operated device to control an image characteristic of an image, comprising:
a base; and
a planar member directly, rotatably connected to the base;
wherein rotation of the planar member with respect to the base changes the image characteristic.

40. The hand operated device of claim 39, wherein the base has at least one, upwardly extending wall, wherein the planar member is directly rotatably connected to the upwardly extending wall.

41. The hand operated device of claim 40, wherein:
the planar member defines a recess in a surface; and
the upwardly extended wall is tapered towards a rounded end received within the recess.

42. The hand operated device of claim 39, wherein rotation of the planar member changes an oblique angle of the image.

43. An imaging system comprising:
a computer to control operation of the system;
a supporting surface; and
a hand operated device coupled to the computer to provide input signals to the computer, the hand operated device comprising:
a base having a bottom surface supported by the supporting surface;
a hand sized planar member; and
a longitudinally extending member having a first end coupled directly and rigidly to the base and a second end rotatably coupled directly to the planar member;
wherein:
the longitudinally extending member, the first end and the second end extend along a single longitudinal axis; and
the computer is programmed to change a characteristic of an image based on manipulation of the device.

44. The imaging system of claim 43, wherein the longitudinally extending member is straight.

45. The imaging system of claim 43, wherein the longitudinally extending member is a one-piece member.

46. The imaging system of claim 43, wherein the image characteristic is TR and/or TE time.

47. The imaging system of claim 43, wherein the image characteristic is field of view.

48. The imaging system of claim 43, wherein the image characteristic is resolution.

49. The imaging system of claim 43, wherein the image characteristic is slice thickness.

50. The imaging system of claim 43, wherein the image characteristic is alignment of the image slice axis.

51. The imaging system of claim 43, wherein the planar member comprises at least one displaceable member to establish an image slice axis to align an image with a predetermined plane with respect to a subject.

52. The imaging system of claim 51, wherein the at least one displaceable member comprises first, second and third buttons, selection of which establishes a slice axis to align an image with a coronal, sagittal and axial plane of a subject, respectively.

53. The imaging system of claim 43, wherein the first end of the coupling member is rigidly mounted to the base.

54. The imaging system of claim 43, comprising:
a magnetic resonance imaging system.

55. A magnetic resonance imaging system comprising:
a computer to control operation of the system; and
a hand operated device coupled to the computer to provide input signals to the computer, the hand operated device comprising:
a base;
a planar member; and a telescoping member having a first end rigidly mounted to the base and a second end rotatably coupled to the planar member;

wherein the computer is programmed to change a characteristic of an image based on manipulation of the device, wherein the image characteristic is at least one of slice thickness, size of field of view and resolution.

56. A magnetic resonance imaging system comprising:

a computer to control operation of the system; and a hand operated device coupled to the computer to provide input signals to the computer, the hand operated device comprising:

a base;

a planar member;

a longitudinally extending member having a first end rigidly mounted to the base and a second end rotatably coupled to the planar member; and at least one displaceable member coupled to the planar member;

wherein the computer is programmed to change TR time and/or TE time based on displacement of the displaceable member.

57. A magnetic resonance imaging system comprising:

a computer to control operation of the system; and a hand operated device coupled to the computer to provide input signals to the computer, the hand operated device comprising:

a base;

a planar member; and a telescoping longitudinal member having a first end coupled to the base and a second end having a rounded surface;

a recess defined in a surface of the planar member to receive the rounded surface;

at least one sensor proximate the rounded surface detect rotation of the planar member; and first, second and third displaceable members coupled to the planar member;

wherein:

rotation of the planar member about the longitudinal member changes a first image characteristic;

telescoping of the longitudinal member changes a second image characteristic; and displacement of one of the first, second and third displaceable members changes an alignment of a slice axis from a first alignment to a second alignment along a coronal, sagittal or axial plane of a subject, respectively.

58. The system of claim 57, wherein:

the second characteristic is chosen from the group consisting of slice thickness, size of field of view and resolution.

59. The system of claim 57, wherein:

the first characteristic is an oblique angle of the image.

60. The system of claim 57, wherein:

displacement of the at least one displaceable member changes TR time and/or TE time.

61. A method of conducting an imaging procedure of a subject with a hand operated device comprising a rotatably supported planar member and first, second and third displaceable members on the planar member, the method comprising:

establishing a slice axis to align an image along one of a coronal, sagittal or axial plane based on selection of a respective one of the first, second or third displaceable members;

establishing an oblique angle of the image by rotation of the planar member; and conducting an imaging scan.

62. A magnetic resonance imaging ("MRI") system, comprising:

a computer to control operation of the system;

a supporting surface; and a hand operated device coupled to the computer to provide input signals to the computer, the hand operated device comprising:

a base having a bottom surface supported by the supporting surface;

a planar member having an exterior boundary and an interior portion within the exterior boundary, the interior portion defining at least one hole therethrough, to receive at least one respective finger of an operator; and a longitudinally extending coupling member having a first end coupled to the base and a second end rotatably coupled directly to the planar member;

wherein the computer is programmed to change a characteristic of a magnetic resonance image based on rotation of the planar member.

* * * * *